Aug. 10, 1965 G. F. SCHROEDER 3,200,020

METHOD OF MAKING A WELDABLE PRINTED CIRCUIT

Filed Dec. 23, 1963 2 Sheets-Sheet 1

GEORGE F. SCHROEDER
*INVENTOR.*

BY

Thomas W. Kennedy

ATTORNEY

Aug. 10, 1965 G. F. SCHROEDER 3,200,020
METHOD OF MAKING A WELDABLE PRINTED CIRCUIT
Filed Dec. 23, 1963 2 Sheets-Sheet 2

GEORGE F. SCHROEDER
*INVENTOR.*

BY

Thomas W. Kennedy
ATTORNEY

United States Patent Office 3,200,020
Patented Aug. 10, 1965

3,200,020
METHOD OF MAKING A WELDABLE PRINTED CIRCUIT
George F. Schroeder, Pines Lake, Wayne Township, N.J., assignor to General Precision Inc., Little Falls, N.J., a corporation of Delaware
Filed Dec. 23, 1963, Ser. No. 332,481
1 Claim. (Cl. 156—3)

This invention relates to printed circuits and more particularly to printed circuit boards having conductor strips with weldable integral tabs.

In the prior are, in order to facilitate the manufacture of electronic modules, and the like, having welded connections between the component leads and the circuit conductor strips, pre-fabricated circuit boards have been used, having conductor strips with weldable integral tabs. This type of weldable circuit board has apertures through which the component leads are passed and has conductor strips with integral tabs adjacent to or overlying the apertures. Conventionally in a circuit board of this type, the conductor strips of electro-deposited alloy material are individually cemented to the insulating sheet using a cold setting cement or adhesive.

One problem with the above circuit board is that its conductor strips tear away from the insulating board particularly next to the component lead apertures, due to a poor connection between the conductor strip and the insulating board. Another problem with the above circuit board is that the material of the conductor strips, which is an electro-deposited alloy material, is subject to tension and bending failures. Still another problem with prior art circuits boards is that the conductor strips, which are composed of electro-deposited alloy materials, can only be welded to certain limited types of component lead alloy materials.

Manufacture of the above prior-art circuit board involves additional problems. One such problem is that it is difficult to obtain a quantity of circuit boards with substantially identical electrical characteristics because of the different relative positions of the strips on each board due to slight variations in individually positioning each strip on its respective board. Another problem is that the manufacturing method is inherently costly as it requires handling each conductor strip as a separate piece in a large series of successive operations.

A further problem in the prior-art method of manufacture is that it is very difficult to apply a corrosion-resistant finish to the conductive strips when desired.

Accordingly, it is an object of the invention to provide a weldable circuit board having conductor strips of wrought-metal material of high structural quality.

Another object is to provide a weldable circuit board having conductor strips with integral tabs composed of wrought-metal alloy material suitable for welding to certain types of component lead alloys.

Still another object is to provide a weldable circuit board in which the integral tab or terminal portion of each conductor strip is connected to the insulating board with equal or more strength than the remaining portions of said conductor strip.

A further object of the invention is to provide a method of manufacture by which weldable circuit boards of substantially identical electrical characteristics can be produced.

A still further object of the invention is to provide a method of manufacture including the well-known and economical operations of printing and etching.

To the fulfillment of these and other objects, the invention provides a weldable printed circuit board comprising an insulating sheet having a plurality of apertures therethrough and a wrought-metal sheet pressure-clad on one side thereof in a pattern of discontinuous lines separated by etched-away perforations, having a plurality of integral tabs overlying the apertures.

In addition, the invention provides a method for manufacture of a weldable printed circuit board of the aforementioned type.

Other objects of the invention will become apparent upon reading the annexed detailed description in connection with the drawings in which.

Figure 1:
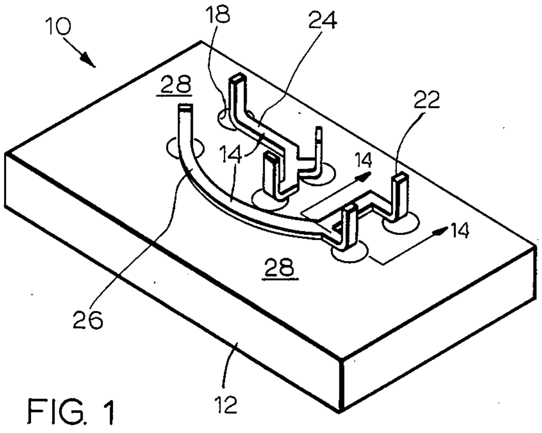
FIGURE 1 is a perspective view of a weldable printed circuit board embodying features of the present invention.

Referring to FIGURE 1, one embodiment of the present invention comprises a weldable printed circuit board 10 comprising an insulating sheet 12 and conductor strips 14, which are laminated together, having a layer of cement 16 (FIGURE 14) there-between. The insulating sheet 12 has a plurality of apertures 18 and conductor strips 14 have a plurality of integral tabs 22 disposed adjacent to the apertures. Metal strips 14 are arrayed in a pattern composed of individual segments 24, 26 which are the remnants of a solid sheet of metal selectively etched away in areas 28 around segments 24, 26.

Insulating substrate 12, preferably made of glass, epoxy or the like, has a plurality of apertures 18 so that a component lead can pass through the insulating sheet at the locus of each aperture. In the manufacture of electronic modules (not shown), one present-day type of assembly (not shown) in which this weldable circuit board 10 is used is the sandwich type of assembly, in which there are a pair of printed circuit boards spaced apart and parallel to each other, having a plurality of components between the confronting surfaces of the boards 10. With this sandwich type of assembly, the pair of circuit boards 10 have substantially the same arrangement for their apertures 18 since each component has a lead 32, one shown at each end extending through a respective board 10.

Tabs 22 which are integral with conductor strips 14 extend slightly over their respective apertures 18 and extend outwardly from the face of the circuit board 10. Strips 14 and tabs 22 in this embodiment are preferably made of nickel as this material is most suitable for making welded connections to nickel alloys which are frequently used in component leads.

The layer of cement 16 between insulating sheet 12 and conductor strips 14 is preferably an epoxy cement, such as epoxy LP–3 Thiokol mixture, or the like. A fairly wide selection of cements are available which may be used to bond metal sheets or foils to insulators. Moreover, with some types of insulating material, no cement is required as the insulator will adhere to the metal foil directly under suitable conditions of heat and pressure.

Conductor strip segments 24, 26 normally extend between component leads (not shown) in a module (not shown) so as to form the desired electrical circuits. Each conductor strip segment 24, 26 has at least two of the integral tabs 22, forming terminals in its respective circuit line, each terminal being disposed adjacent to a component lead aperture 18.

Tab 22 is very suitable for making a welded connection to its adjacent component lead, preferably by resistance welding, since the tab can hold its position substantially at right angles to the face of the circuit board 10 in side-by-side relation with the adjacent surface of the paralleling component lead wire. This feature facilitates manufacture of modules using automatic welding devices in combination with this type of weldable circuit board 10.

A first advantage of this circuit board 10 is that its conductor strips 14 are made of a wrought metal, which has superior structural and metallurgical properties to cast, plated or electro-deposited metals. This is in contrast to the prior-art weldable circuit boards, in which the conductor strips are metals made by electro-depositing methods, which are subject to metallurgical flaws and non-uniformity of strip thickness causing poorer reliability relative to the wrought material. A second advantage of this device is that since the conductor strips 14 are composed of a wrought metal, the device can be used in many diverse applications where wrought metals and alloys of distinct characteristics are required for other reasons, such as, for welding to component leads composed of certain types of alloy metal. With the prior-art type of circuit board with electro-deposited metal strips and tabs, it is impossible to make sound welds to such types of alloy metal. A third advantage of this device is that the connecting bond between each of the conductor strip segments 24, 26 and the insulating sheet 12, particularly adjacent to each tab 22, is of uniformly good quality. This superior quality of adhesion and bond between the conductor strips 14 and the insulating sheet 12 extends the service life of the circuit board 10. The superior connecting bond next to each integral tab 22 helps to support the adjacent component lead and extends the service life of the components in the module.

In order to manufacture the above weldable printed circuit boards with integral tabs, a method including the etched foil techniques of manufacture is desirable, rather than using the prior art method including cementing each separate conductor strip to the insulating board. In the past, other types of printed circuit boards have been made by methods including the etched foil techniques of manufacture. In the method of manufacture in accordance with this invention, the etched foil techniques of manufacture have been incorporated as discussed hereafter.

In the method of manufacture in accordance with the invention, apertures 18 are first provided in the insulating sheet 12. A metal sheet 14′ is then bonded to the insulating sheet 12 using a layer of cement 16 therebetween. Apertures 18 are then filled with an acid-resist material. An acid-resist pattern of the final circuit is placed on top of metal sheet 14′ preferably by means of a photographic silk screen technique. The acid-resist pattern is the same as the pattern lines or conductor strip segments 24, 26 of the metal sheet. The acid-resist pattern includes tab portions extending over the apertures 18 of the insulating sheet 12. This entire assembly is then etched in acid to remove all the nickel except where covered by the acid-resist pattern. Thereafter, the integral tabs 22 are bent-up, substantially at right angles to the face of the insulating sheet 12, such as by the insertion of small rods through the apertures 18, or the like, preferably in a single punching operation. The above method of manufacture thereby provides a printed circuit with raised tabs suitable for welding.

Figures 2, 3, 4, 5, 6, 7, 8, 9, 10, 11, 12, 13:
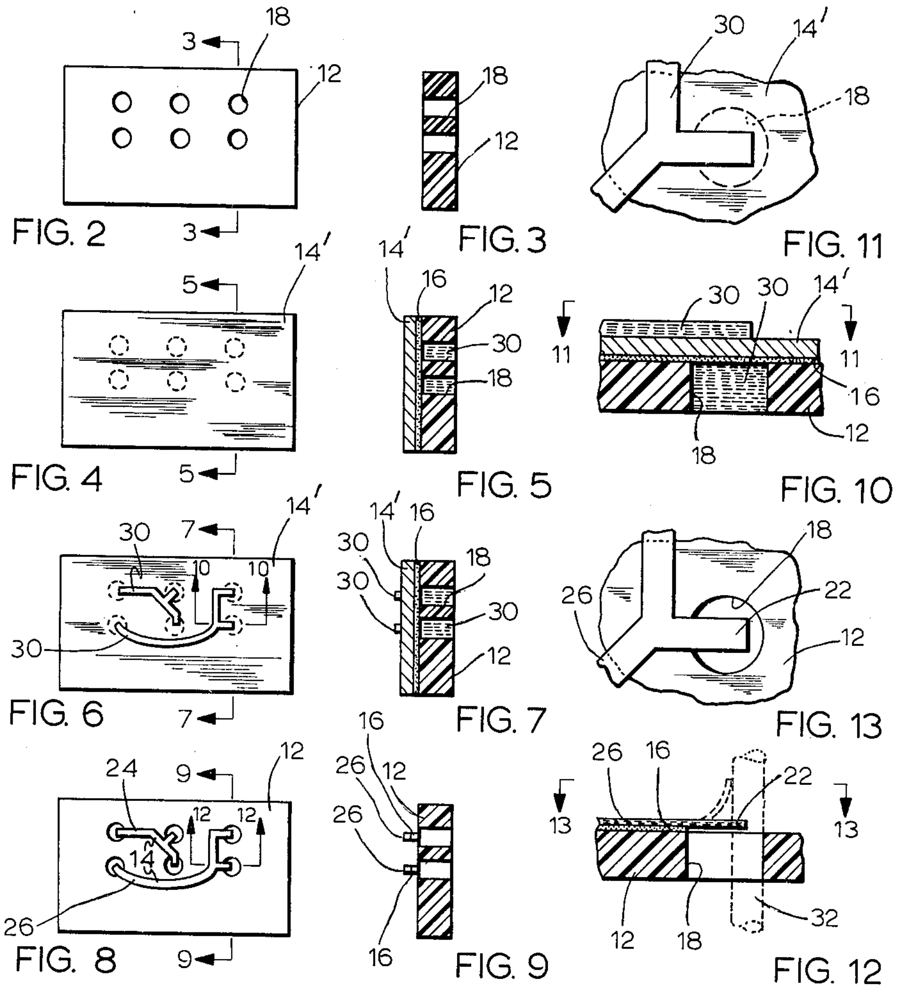
FIGURE 2 is an elevation view of an insulating sheet used in the method of making a weldable circuit board.
FIGURE 3 is a sectional view as taken on line 3—3 of FIGURE 2.
FIGURE 4 is an elevation view of a laminated metal sheet and insulating sheet used in a later stage in the process of making a weldable printed circuit board.
FIGURE 5 is a sectional view as taken on line 5—5 of FIGURE 4.
FIGURE 6 is an elevation view of a printed circuit board at a still larger stage in the process of making said board.
FIGURE 7 is a sectional view as taken on line 7—7 of FIGURE 6.
FIGURE 8 is an elevation view of a printed circuit board at a still later stage in the process of making said board.
FIGURE 9 is a sectional veiw as taken on line 9—9 of FIGURE 8.
FIGURE 10 is a detailed sectional view as taken on line 10—10 of FIGURE 6.
FIGURE 11 is a plan sectional view as taken on line 11—11 of FIGURE 10.
FIGURE 12 is a detailed sectional view as taken on line 12—12 of FIGURE 8.
FIGURE 13 is a plan sectional view as taken on line 13—13 of FIGURE 12.

FIGURES 2–9 inclusive illustrate the various steps in the method of manufacture in accordance with the invention. The insulating sheet 12, as illustrated in FIGURES 2 and 3, is provided with apertures 18, preferably by drilling holes therethrough, the holes being located at the points where the component leads (not shown) are expected to pass through the circuit board 10. As illustrated in FIGURES 4 and 5, the metal sheet 14′ is cemented to the insulating sheet 12 so that there is a layer of cement 16 between sheets 12 and 14′. An acid-resist material 30 is deposited in the apertures 18, preferably after the cementing operation. It is preferable if the metal sheet 14′ is also laminated to the insulating sheet 12 by high temperature and high pressure techniques as part of said cementing operation. As illustrated in FIGURES 6 and 7, acid-resist material 30 is applied to the face of the metal sheet 14′ in a desired circuit pattern. There are various methods of depositing the resist material 30. In one method using a stencil screen, the fluid resist material 30 is pressed through the screen, forming the pattern on the metal sheet 14′. In another, photomechanical method of depositing the resist, a suitable emulsion is used to form a film on the metal sheet 14′. A negative of the circuit is placed then on top of the sensitized laminate, and then exposed to an arc light, and subsequently immersed in a developer, which dissolves away the unexposed photosensitive coating. A still further method of applying the resist pattern is by the offset-lithoprinting method.

As illustrated in FIGURES 8 and 9, after the laminated circuit board 10 is suitably etched, for example in an etching tank, the unprotected bare metal is dissolved leaving the areas of the insulating sheet 12 exposed. Where the acid-resist material 30 was applied in a circuit pattern, the metal strips 14 are unaffected, leaving an insulating sheet 12 having cemented thereto the lines of a pattern of individual conductor-strip segments 24, 26. As shown in FIGURES 8, 9, board 10, including its apertures 18, has been cleaned of acid-resist 30.

Figures 14, 15, 16, 17, 18, 19:
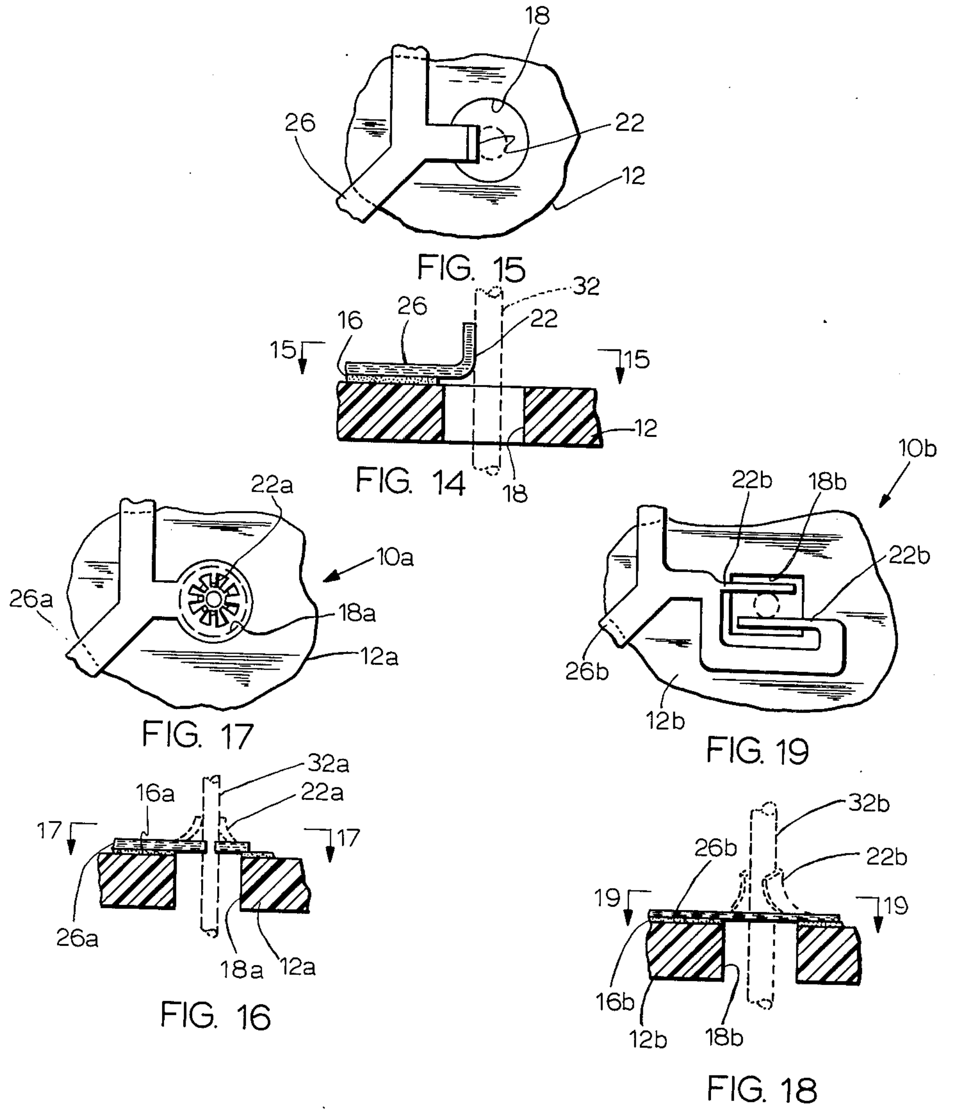
FIGURE 14 is a detailed sectional view similar to FIGURE 12.
FIGURE 15 is a plan sectional view taken on line 15—15 of FIGURE 14.
FIGURE 16 is a detailed sectional view similar to FIGURE 12.
FIGURE 17 is a plan sectional view taken on line 17—17 of FIGURE 16.
FIGURE 18 is a detailed sectional view similar to FIGURE 12.
FIGURE 19 is a plan sectional view taken on line 19—19 of FIGURE 18.

As shown in FIGURES 12 and 13, at each aperture 18, a tab portion 22 of each adjacent conductor strip segment 24, 26 extends over the aperture 18 which has been cleaned to remove one acid-resist 30. It is noted that the cement 16 between the tab 22 and the insulating sheet 12 adjacent to each aperture 18 extends right to the edge of the adjacent aperture 18 giving an excellent bond between the tab 22 and the insulating sheet 12. As shown in FIGURES 14 and 15, each integral tab 22 is bent up substantially at right angles to the face of the insulating sheet. As illustrated in FIGURE 1, it would be a simple problem to provide a punching plate having a plurality of punch bars located at the apertures of the circuit board 10, and thereby bend up the integral tabs 22 by a single punching operation. During such a punching operation, a suitable mandrel, (not shown) may be provided over the side of the circuit board 10 having the conductor segments 24, 26, thus providing a backup for each conductor segments 24, 26 adjacent to each integral tab 22.

Considering now the advantages of the method of manufacture of the circuit board 10, a primary advantage is that procedures similar to that used in ordinary printed circuit layout techniques are possible. With these techniques, no special tooling is required, thus permitting economical manufacture in small lots, in addition to large or mass production. With the method of manufacture in accordance with the invention, a second advantage is that the conductor strips 14 can be effectively finished by plating. Plated strips are necessary in certain applications, where it is desired to provide a non-corrosive, or wear-resistant finish to the conductor strip segments 24, 26 including the tab portions 22. The strips are coated or plated by slightly modifying the abovementioned sequence of operations, including first printing the circuit pattern in reverse, using a suitable resist. In this way, the circuit lines on the metal sheet 14′ are exposed. The desired, protective-metal coating is then electroplated on the exposed nickel surface to form the circuit lines with plating. The resist is then removed with the aid of a solvent, or the like, from the exposed surfaces of the metal sheet 14′. The portion of the metal sheet which is plated forms the pattern lines and conductive strip segments 24, 26; and the plated finish on the pattern lines acts as the acid-resist coating during the subsequent etching operation.

A third advantage of the method of manufacture is that it is suited to manufacturing multi-layer circuit boards having integral welded tabs. For example, a circuit board with conductor strips 14 on each side of sheet 12 can be made by this method. The method of making such a two-sided circuit board is described hereafter. In the previously-described series of operations of manufacture, after providing the conductor strips 14 on one side of the insulating sheet 12, and prior to the operation of bending up the integral tabs preferably, and also prior to the operation of removing the acid-resist material from the surfaces of the conductive strips, and from the apertures 18, that is in the condition illustrated in FIGURE 6 and 7, the entire series of operations are repeated on the other side of sheet 12. The additional operations include applying a second metal sheet (not shown) on the opposite face of the insulating sheet 12, filling the apertures 18 with acid-resist material, stenciling the metal surface with an acid-resist material of the required circuit pattern, and then etching the entire board 10 again. In this way, both sides of the circuit board 10 would have a plurality of conductor strips. With this type of two-layer circuit board (not shown), a pair of integral tabs are disposed at each aperture, which can be connected to a single component lead, or connected to each other.

A fourth advantage of this method of manufacture is that it lends itself to ease of manufacturing of intricate terminals adjacent to each aperture 18. Such intricate terminals are subsequently described herein, under a disclosure of a second and third embodiment of the device.

A second embodiment of the invention is a weldable printed circuit board which is substantially the same as that illustrated in FIGURES 1–15 inclusive and as previously described, with the exception of a modified type of integral tab. As illustrated in FIGURES 16 and 17, the integral tab of this embodiment may be compared to that of the previous embodiment as illustrated in FIGURES 12 and 13. For ease of understanding, the similar parts of this embodiment in FIGURES 16 and 17, have been designed by the same reference numerals but with a subscript "*a*" added thereto. With the circuit board of the second embodiment, each of the conductor strip segments 24*a*, 26*a* has a plurality of integral tabs 22*a*, disposed adjacent to apertures 18*a* in insulating sheet 12*a*. Each integral tab 22*a* is an eyelet having a peripheral portion which is bonded by cement 16*a* to the face of the insulating sheet 12*a* surrounding the aperture 18*a*, and having a portion overlying the aperture, with a plurality of inwardly pointing tabs forming a multi-slotted opening or star-shaped opening therethrough. In this way, the conductor segment 26*a* has a terminal portion adjacent each of its apertures 18*a*, the terminal portion having a plurality of tabs 22*a*. In this embodiment, tabs 22*a* are normally flat, in the same plane as the remainder of the conductor segment 26*a*. As illustrated in FIGURE 16, when a component lead 32*a* is inserted through the eyelet portion of the segment 26*a*, the tabs 22*a* are bent upwardly away from the aperture 18*a*. Thus, the eyelet portions or terminals of the conductor strip segments 24*a*, 26*a* position the component leads through the respective apertures 18*a*, and by their clamping action provide a good connection with the component lead 32*a*. In an electronic assembly or module, this clamp-type of terminal connection provides additional stiffness and rigidity. By analogy, the circular slotted shape of the terminal is similar to a jam nut. This type of terminal is also highly desirable when using an electron beam welding technique, since the terminal or jam nut would hold the component lead 32*a* in place and also allow the electron beam to impinge directly on the two pieces to be welded. In this embodiment, in addition, the terminal portion is normally stronger and better connected to insulating sheet 12*a*, than the remaining portions of strip 26*a*.

In a third embodiment of the invention, a weldable printed circuit board is provided, which is substantially similar to the circuit board 10, as illustrated in FIGURES 1–15, of the first embodiment, with the exception of another modified type of integral tab. The modified tab of this embodiment, as illustrated in FIGURES 18 and 19, is one of a plurality of terminals of the conductor strip segments 24*b*, 26*b*. For ease of understanding, the parts of this third embodiment, in FIGURES 18 and 19, which are like the parts of the first embodiment, in FIGURES 1–15 inclusive, have been designated by the same reference numerals but with a subscript "*b*" added thereto. The terminal portion of the conductor segment 26*b* is bonded to the insulating sheet 12*b* by adhesive cement 16*b*. Each terminal portion of the conductor segment 26*b* has a pair of integral tabs 22*b*, which are relatively longer than the similar tabs in the previous two embodiments. A component lead 32*b* is illustrated in FIGURES 18 and 19 showing schematically how the pair of integral tabs 22*b* are bent upwardly and away from the face of the circuit board 10*b*, being disposed on opposite sides of the component lead 32*b*. This arrangement is suitable for resistance welding since it provides a two-sided resistance weld on the component lead 32*b*. Such relatively longer tabs 22*b* are also desirable when doing welded connections on a dense or crowded circuit assembly, as the head of the welding fixture can be held further away from the face of the circuit board 10*b*. Such longer tabs 22*b* are also useful in multi-layer board construction, where it is possible to bring a plurality of tabs through a common aperture 18*b*, and out into the open on one side of the circuit board 10*b*, where the interconnection between layers by welding can be done. This type of intricate terminal of the conductor strip segments 24*b*, 26*b* can also be slightly modified to be suitable for other special application and assemblies.

A weldable printed circuit board in accordance with this invention has an improved structure partly due to the superior interconnection of its parts, such as the interconnection of the conductor strips 14 to the insulating sheet 12 and the interconnection of the integral tabs 22 to the conductor strip segments 24, 26. In addition, its method of manufacture is economical with simple operations in assembly and fabrication; and can produce many different species of this type of circuit board 10, having different types of intricate terminals.

While the present invention has been described in detail in various embodiments, it will be obvious to those skilled in the art after understanding this invention that various changes and modifications may be made therein without departing from the spirit or scope thereof. It is intended by the appended claim to cover all such modifications.

What is claimed is:

A method of manufacturing a weldable printed circuit board comprising the sequential steps of:

providing apertures in an insulating sheet located opposite the terminals of a desired circuit layout, bonding a metal sheet to one side of the insulating sheet, filling the apertures with an acid-resist material from the other side of the insulating sheet, removing the unwanted portions of the metal sheet by an etching process, to provide a printed circuit board having conductor strips with weldable integral tabs overlying the board apertures at the circuit terminals.

References Cited by the Examiner

UNITED STATES PATENTS

| | | | |
|---|---|---|---|
| 2,433,384 | 12/47 | McLarn. | |
| 2,917,678 | 12/59 | Tepper | 174—68.5 X |
| 3,013,188 | 12/61 | Kohler | 174—68.5 X |
| 3,079,577 | 2/63 | Brownfield | 339—17 |
| 3,098,951 | 7/63 | Ayer et al. | 174—68.5 X |

FOREIGN PATENTS

| | | |
|---|---|---|
| 646,314 | 11/50 | Great Britain. |
| 724,379 | 2/55 | Great Britain. |

OTHER REFERENCES

Welded Circuitry for Miniaturization, Sayles, published in Electronic Products Magazine, June 1961, pp. 8 and 9.

JOHN F. BURNS, *Primary Examiner.*

JOHN P. WILDMAN, E. JAMES SAX, *Examiners.*